(12) United States Patent
Strachan et al.

(10) Patent No.: US 10,770,140 B2
(45) Date of Patent: Sep. 8, 2020

(54) MEMRISTIVE ARRAY WITH PARALLEL RESET CONTROL DEVICES

(71) Applicant: Hewlett Packard Enterprise Development LP, Houston, TX (US)

(72) Inventors: John Paul Strachan, San Carlos, CA (US); Brent Buchanan, Palo Alto, CA (US); Le Zheng, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/065,771

(22) PCT Filed: Jan. 27, 2016

(86) PCT No.: PCT/US2016/015054
§ 371 (c)(1),
(2) Date: Jun. 22, 2018

(87) PCT Pub. No.: WO2017/131651
PCT Pub. Date: Aug. 3, 2017

(65) Prior Publication Data
US 2019/0027217 A1 Jan. 24, 2019

(51) Int. Cl.
*G11C 13/00* (2006.01)
*G11C 11/56* (2006.01)

(52) U.S. Cl.
CPC ...... *G11C 13/0069* (2013.01); *G11C 11/5685* (2013.01); *G11C 13/003* (2013.01); *G11C 13/0026* (2013.01); *G11C 13/0028* (2013.01); *G11C 13/0097* (2013.01); *G11C 13/0007* (2013.01); *G11C 2213/79* (2013.01)

(58) Field of Classification Search
CPC ............ G11C 13/0069; G11C 11/5685; G11C 13/0007; G11C 13/0026; G11C 13/0097; G11C 13/0028; G11C 13/003; G11C 2213/79
See application file for complete search history.

(56) References Cited

U.S. PATENT DOCUMENTS

| 7,298,640 B2 | 11/2007 | Chen et al. |
| 7,830,693 B2 | 11/2010 | Liu et al. |

(Continued)

FOREIGN PATENT DOCUMENTS

| EP | 1557841 A2 | 7/2005 | |
| WO | WO-2015016916 | 2/2015 | |
| WO | WO-2015016916 A1 * | 2/2015 | ....... H01L 29/66106 |

OTHER PUBLICATIONS

Ascoli A. et al., "Unfolding the Local Activity of a Memristor", (Research Paper), Proceedings for Cellular Nanoscale Networks and their Applications (CNNA), Jul. 29-31, 2014, pp. 1-2.

(Continued)

*Primary Examiner* — Mushfique Siddique

(57) ABSTRACT

The present disclosure provides a memristive array. The array includes a number of memristive devices. A memristive device is switchable between states and is to store information. The memristive array also includes a parallel reset control device coupled to the number of memristive devices in parallel. The parallel reset control device regulates a resetting operation for the number of memristive devices by regulating current flow through target memristive devices.

16 Claims, 5 Drawing Sheets

(56) References Cited

U.S. PATENT DOCUMENTS

| | | | |
|---|---|---|---|
| 8,331,127 B2 | 12/2012 | Chen et al. | |
| 8,416,604 B2* | 4/2013 | Kim | G11C 11/5685 |
| | | | 365/100 |
| 8,773,167 B2* | 7/2014 | Robinett | G11C 13/0007 |
| | | | 326/104 |
| 2008/0123392 A1* | 5/2008 | Kinoshita | G11C 13/0007 |
| | | | 365/148 |
| 2009/0067229 A1 | 3/2009 | Kang et al. | |
| 2010/0046270 A1 | 2/2010 | Katoh et al. | |
| 2012/0014175 A1 | 1/2012 | Wang et al. | |
| 2012/0044742 A1 | 2/2012 | Narayanan et al. | |
| 2013/0070534 A1* | 3/2013 | Carter | G11C 7/12 |
| | | | 365/189.05 |
| 2013/0313623 A1 | 11/2013 | Vrudhula et al. | |
| 2014/0153314 A1* | 6/2014 | Baker | G11C 13/0002 |
| | | | 365/148 |
| 2014/0215121 A1* | 7/2014 | Ordentlich | G06F 11/1096 |
| | | | 711/102 |
| 2014/0266118 A1* | 9/2014 | Chern | H02M 3/156 |
| | | | 323/283 |
| 2014/0355331 A1* | 12/2014 | Yi | G11C 11/56 |
| | | | 365/148 |
| 2017/0287558 A1* | 10/2017 | Liu | G11C 13/0069 |

OTHER PUBLICATIONS

Chang, M. F., et al., "Set-Triggered-Parallel-Reset Memristor Logic for High-Density Heterogeneous-Integration Friendly Normally Off Applications"; In: IEEE Transactions on Circuits and Systems II: Express Briefs, Jan. 2015, vol. 62, No. 1. pp. 80-84 <URL: http://ieeexplore.ieee.org/document/6922503> See pp. 82-83.

* cited by examiner

MEMRISTIVE ARRAY WITH PARALLEL RESET CONTROL DEVICES

GOVERNMENT LICENSE RIGHTS

This invention was made with government support under IARPA-2014-14080800008 awarded by the Intelligence Advanced Research Projects Activity (IARPA). The government has certain rights in the invention.

BACKGROUND

Memristive devices, for example memristors, are devices that can be programmed to different states by applying a programming stimulus, for example a voltage pulse or a current pulse. After programming, the state of the memristive device may be read. The state of the memristive device remains stable long enough to regard the device as non-volatile. A number of memristive devices may be included within a crossbar array in which a number of interconnect lines intersect one another to form a grid, the memristive device being located at the intersection of corresponding interconnect lines. These arrays can provide high storage density. Memristor devices can be used in a variety of applications, including non-volatile solid state memory, programmable logic, signal processing, control systems, pattern recognition, and other applications.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1:
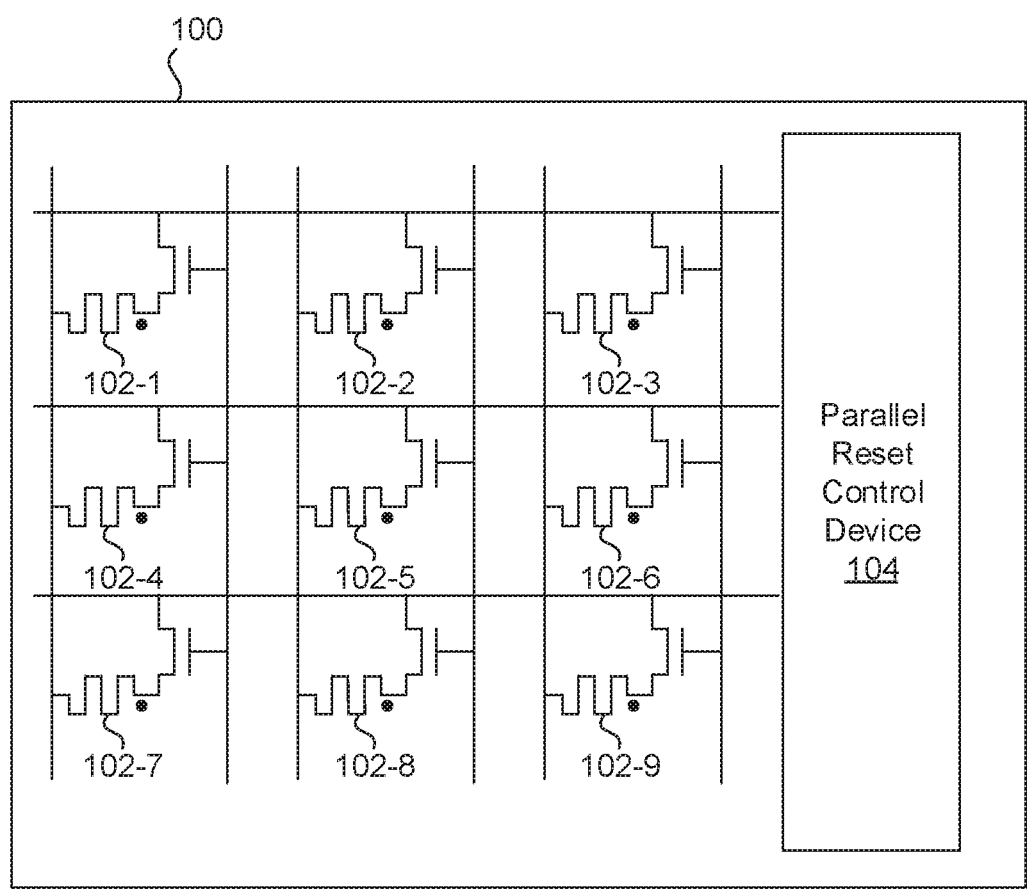
FIG. 1 is a diagram of a memristive array with a parallel reset control device, according to one example of the principles described herein.

Arrays of memristive devices such as memristors may be used in a variety of applications, including non-volatile solid state memory, programmable logic, signal processing, control systems, pattern recognition, and other applications. Increasingly smaller computing devices have led to an increased focus on developing smaller components, such as memory arrays and integrated circuits that carry out the functions listed above as well as other functions. Crossbar arrays are one example of reduced-size arrays. A crossbar array includes a first set of interconnect lines that intersect a second set of interconnect lines, in an approximately orthogonal orientation for example. Throughout the specification, the first set of interconnect lines may be referred to as row lines and the second set of interconnect lines may be referred to as column lines. However the terms row and column are merely used to simplify the description and the first set of interconnect lines and second set of interconnect lines may be oriented in other fashions than rows or columns.

A memristive device is placed at each intersection of a row line and a column line. A memristive device is switchable between states and can store information. In other words, the memristive array can be a memory device. In a crossbar array, a number of memristive devices may share a particular row line and another number of memristive devices may share a particular column line.

The array of the present application can also be used to perform a multiply-accumulate (MAC) operation of, for example, a number of matrix values and a number of input vector values. For example, an input voltage signal along each row of an array is weighted by the resistance of the memristive devices in a column, and accumulated as the current output from each column. Accordingly, a state of a memristive device can be used to either store information such as in a memory array, or can be used to perform operations such as a multiply-accumulate operation which is used in filtering.

In either case, each memristive device can represent multiple logic values, for example a 1 and a 0. Memristive devices are also capable of representing more values, for example, up to four and higher numbers of logic values. Memristive devices use resistance levels to indicate a particular logic value. In using a memristor as an element in an array, a digital operation is emulated by applying an activation stimuli such as voltage pulses of different values or polarities to place the memristive device in different states. Switching a memristive device such as a memristor from a higher resistance state in the direction of a lower resistance state is referred to as a "set" operation and switching the memristive device form a lower resistance state in the direction of a higher resistance state is referred to as a "reset" operation.

Each memristive device has a switching voltage which refers to a voltage potential across a memristive device which starts a change in the resistance state of the memristive device. In this example, a voltage potential across the memristive element that is greater than the switching voltage causes the memristive device to begin to change between resistance states. While memristive device arrays have the potential for widespread application, some characteristics reduce their usefulness in certain applications.

For example, while memristive devices have the capability of representing multiple logic values by being placed in multiple resistance states, the memristive device switching dynamics makes accessing these multiple resistance states difficult. More specifically, control circuits to switch the memristive devices tend to over-drive the memristive devices making it difficult to place them in intermediate states between a highest resistance state and a lowest resistance state. This is apparent for both the set and reset operations. For example, a reset operation is dominated by a voltage potential across the memristive device and as the memristive device resistance increases, the greater the voltage drop across it grows, which further increases the resistance. This feedback mechanisms make it difficult to stop the reset switching operation when the memristive device reaches an intermediate state.

The difficulty in resetting a memristive device also affects the setting of a memristive device. For example, when a memristive device has been over-driven in a reset direction, there is very little current passing through the memristive device for a given voltage. Accordingly, to increase current flow and begin the set operation, an increased amount of voltage is applied to the memristive device. However, as the current begins to flow, the increased voltage application increases the speed of the setting operation. This positive feedback may lead to over-driving the set operation, which further increases the difficulty of setting the memristive device to an intermediate state. For at least these reasons, regulating a reset operation is difficult at best, and so difficult in fact that many applications avoid the use of any sort of reset control at all.

Accordingly, the present specification describes a memristive array that alleviates these and other complications. Specifically, the memristive array includes a parallel reset control device that can be resistor-based or transistor-based. This parallel reset control device is coupled in parallel to the memristive devices of the array. Doing so allows the resetting operation for a memristive device to have a high resistance threshold that is adjustable on-the-fly. Such on-the-fly adjustment allows for resetting a memristive device to intermediate states which intermediate states are used in multi-level memory applications, neural network applications, and analog computations such as computing a dot product. While specific reference is made to particular applications, the subject matter of the present disclosure can be used in a variety of other applications.

More specifically, the present specification describes a memristive array. The array includes a number of memristive devices. A memristive device is switchable between states and is to store information. The memristive array also includes a parallel reset control device coupled to the number of memristive devices in parallel. The parallel reset control device regulates a resetting operation for the number of memristive devices by regulating current flow through target memristive devices.

The present specification also describes a method for programming a memristive array. According to the method, a target state for a target memristive device is selected. A resistance of a parallel reset controller coupled to the target memristive device is set. The resistance of the parallel reset controller is set to a resistance value that corresponds to the target state. The state of the target memristive device is then programmed to the target state. This is done by generating a voltage potential across the target memristive device and the parallel reset controller.

The present specification also describes a memristive crossbar array that includes a number of row lines and a number of column lines intersecting the row lines to form a number of junctions. A number of memristive devices are coupled between the row lines and the column lines at the junctions. A memristive device is switchable between states to store information. The memristive crossbar array also includes multiple parallel reset controllers. A parallel reset controller is coupled to a row line to regulate current through a corresponding row of memristive devices by drawing current away from a target memristive devices when a resistance of the target memristive device reaches a threshold value.

Using a parallel reset control device 1) allows for resetting a memristive device to intermediate states; 2) reduces the likelihood of over-driving the memristive device; 3) slows down the resetting operation thereby improving the convergence towards a target state; 4) maintains a small footprint on an integrated circuit; and 5) can be used in memory where a single memristive device stores more than two bits of information. However, it is contemplated that the devices disclosed herein may provide useful in addressing other matters and deficiencies in a number of technical areas. Therefore the systems and methods disclosed herein should not be construed as addressing any of the particular matters.

As used in the present specification and in the appended claims, the term "memristive device" or "memristor" may refer to a passive two-terminal circuit element that maintains a functional relationship between the time integral of current, and/or the time integral of voltage.

Further, as used in the present specification and in the appended claims, the term "state" refers to a defined configuration of a memristive device wherein the memristive device has defined characteristics. A state may be associated with a logic value. For example, resistance states of a memristive device refers to distinct and different configurations of the memristive device having defined resistance values. Similarly, conductance states of a memristive device refers to distinct and different conductance levels of a memristive device.

Still further, as used in the present specification and in the appended claims, the term "target device," "target memristive device" or similar terminology refers to a memristive device that is to be read from or written to. For example, a target memristive device is a memristive device whose state is going to be changed via a set or reset operation. Target row lines and target column lines refer to those lines that correspond to the target memristive device.

Even further, as used in the present specification and in the appended claims, the term "target state" refers to a desired state, and corresponding logic value, for the target memristive device.

Even further, as used in the present specification and in the appended claims, the term "direction" refers to a movement of a memristive device between states device having increased or decreased values for certain properties. For example, switching in a first direction may mean that the memristive device is passing through states of decreasing resistance. Switching in a second direction may mean that the memristive device is passing through states of increasing resistance. It should be noted that an increasing direction of resistance is the same as a decreasing direction of conductance and a decreasing direction of resistance is the same as an increasing direction of conductance.

Even further, as used in the present specification and in the appended claims, the term "switching voltage" may refer to a voltage potential across a memristive device which initializes a change in the state of the memristive device. For example, a switching voltage of a memristive device may be between 1-2 volts (V). In this example, a voltage potential across the memristive device that is greater than the switching voltage (i.e., the 1-2 V) causes the memristive device to change between resistance states. A memristive device may have multiple switching voltages. For example, a first switching voltage may be a voltage which, if surpassed, "sets" the memristive device from a high resistance state to a low resistance state. Similarly, a second switching voltage may a voltage which, if surpassed, "resets" the memristive device from a low resistance state to a high resistance state. While specific reference is made to a voltage pulse, the activation stimuli to change the state of the memristive device may also be provided by a current.

Even further, as used in the present specification and in the appended claims the term "interconnect lines" refers to conducting electrical lines that are used to select a memristive device. The interconnect lines include the first lines i.e., row lines and the second lines i.e., the column lines.

Yet further, as used in the present specification and in the appended claims, the term "a number of" or similar language is meant to be understood broadly as any positive number including 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language indicates that a particular feature, structure, or characteristic described in connection with that example is included as described, but may not be included in other examples.

Turning now to the figures, FIG. 1 is a diagram of a memristive array (100) with a parallel reset control device (104), according to one example of the principles described herein. The memristive array (100) includes a number of memristive devices (102-1, 102-2, 102-3, 102-4, 102-5, 102-6, 102-7, 102-8, 102-9). As used in the present specification, the indicator "-*" refers to a specific instance of an element. For example, a first memristive device is referenced as (102-1). The absence of the indicator "-*" refers to the element in general. For example, a generic memristive device is referenced as (102). In the figures, a top electrode of the memristive device (102) is indicated with a dot.

A memristive device (102) stores information based on a resistance level of the memristive device (102), each level corresponding to a state of the memristive device (102). By switching between resistance states, the memristive device (102) therefore represents multiple logic values and stores multiple bits of information. Put another way, the memristive device (102) can be used to represent a number of bits of data. For example, a memristive device (102) in a first resistance state may represent a logic value of "1." The same memristive device (102) in a second resistance state may represent a logic value of "0." As the memristive device (102) is capable of having multiple resistance states, the memristive device (102) is also capable of representing more than just two (i.e., 0 and 1) logical values. Each logic value is associated with a resistance state of the memristive device (102) such that data can be stored in a memristive device (102) by changing the resistance state of the memristive device (102). This may be done by applying a voltage potential across a target memristive device (102) by passing voltages to interconnect lines that correspond to the target memristive device (102). While specific mention is made of memristive devices (102) representing two logic values, i.e., a binary memristive device (102), a memristive device (102) can have any number of resistance states and therefore can represent any number of logic values. For example a memristive device (102) can have three, four, or even more resistance states.

A memristive device (102) changes resistances by transporting dopants within a switching layer to increase or decrease the resistivity of the memristive device (102). As a sufficient voltage is passed across the memristive device (102) the dopants become active such that they move within a switching layer of the memristive device (102) and thereby change the resistance of the memristive device (102).

A memristive device (102) is non-volatile because the memristive device (102) maintains its resistivity, and indicated logic value even in the absence of a supplied voltage. In this manner, the memristive devices (102) are "memory resistors" in that they "remember" the last resistance that they had. Put another way, if charge flows in one direction through a memristive device (102), the resistance of that component of the circuit will increase. If charge flows in the opposite direction in the memristive device (102), the resistance will decrease. If the flow of charge is stopped by turning off the applied voltage, the memristive device (102) will "remember" the last resistance that it had, and when the flow of charge starts again the resistance of the memristive device (102) will be what it was when it was last active.

Memristive devices (102) in a memristor array may take many forms. One example is a metal-insulator-metal structure where the memristive devices (102) include a first conductive electrode a second conductive electrode and a switching element placed between the conductive electrodes. The first and second conductive electrodes may be formed of an electrically conductive material such as AlCu, AlCuSi, TaAl, TiN, HfN, AlN, Pt, Cu, and WSiN. In some examples the first and second electrode are formed of the same material, and in other examples the second electrode is formed of a different material than the first electrode.

The switching element may be formed of a switching oxide, such as a metallic oxide. Specific examples of switching oxide materials may include magnesium oxide, titanium oxide, zirconium oxide, hafnium oxide, vanadium oxide, niobium oxide, tantalum oxide, chromium oxide, molybdenum oxide, tungsten oxide, manganese oxide, iron oxide, cobalt oxide, copper oxide, zinc oxide, aluminum oxide, gallium oxide, silicon oxide, germanium oxide, tin dioxide, bismuth oxide, nickel oxide, yttrium oxide, gadolinium oxide, and rhenium oxide, among other oxides. In addition to the binary oxides presented above, the switching oxides may be ternary and complex oxides such as silicon oxynitride. The oxides presented may be formed using any of a number of different processes such as sputtering from an oxide target, reactive sputtering from a metal target, atomic layer deposition (ALD), oxidizing a deposited metal or alloy layer, etc. The memristive device (102) may be fabricated through any other reasonably suitable fabrication process, such as, for example, chemical vapor deposition, sputtering, etching, lithography, or other methods of forming memristive device (102).

The memristive devices (102) may be built at the micro- or nano-scale and used as a component in a wide variety of electronic circuits, such as, bases for memories and logic circuits. As described above, when used as a basis for memories, the memristive device (102) may be used to store bits of information. When used as a logic circuit, as described herein, the memristive device (102) may be employed to represent bits in a field programmable gate array, as the basis for a wired-logic programmable logic array, or as a dot product engine. The memristive device (102) disclosed herein may also find use in a wide variety of other applications.

The state of the memristive devices (102) may be changed in response to various programming conditions and the memristive device (102) is able to exhibit a memory of past electrical conditions. For instance, the memristive device (102) may be programmed to have one of a plurality of distinct states. Particularly, the resistance level of the switching element may be changed through application of an electrical field, e.g., through application of a current or voltage, in which the current or voltage may cause mobile dopants in the switching element to move and/or change the status of conducting channel(s) in the switching element, which may alter the resulting electrical operation of the memristive device (102). That is, for instance, the distinct resistance levels of the switching element, and thus the state of the memristive device (102), may correspond to different programming current levels or voltage amplitudes applied to the switching element.

By way of example, the switching element may be programmed to have a higher resistance level through application of an earlier current or voltage level. After removal of the current or voltage, the locations and characteristics of the dopants or conducting channels are to remain stable until the application of another programming electrical field. That is, the switching element remains at the programmed resistance level following removal of the current or voltage. While specific reference is made to memristive devices (102), other resistive memory elements may be used also. Other examples of resistive memory elements include resistive random-access memory (RRAM) elements, phase-change random-access memory (PCRAM), and magnetoresistive random-access memory (MRAM).

The memristive array (100) also includes a parallel reset control device (104). The parallel reset control device (104) may include multiple reset controllers that are coupled to rows of memristive devices (102). For example, each row of memristive devices (102) may have a corresponding reset controller. The parallel reset control device (104) regulates a resetting operation for the memristive devices (102) by regulating current flow through a target memristive device (102). For example, as described above, memristive devices (102) can be programmable to multiple states. For example, a memristive device (102) may be more than a binary device. However, the switching dynamics may make it difficult to switch a memristive device (102) from a low resistance state to a high resistance state, especially when an intermediate state is desired. More specifically, positive feedback during a reset operation tends to over-drive the memristive device (102) towards a high resistance state, making it difficult to slow, or stop, a reset operation once an intermediate target state is reached.

The parallel reset control device (104) regulates this resetting operation by slowing down the resetting operation as the target memristive device (102) approaches a desired state, or stops the resetting operation as the target memristive device (102) reaches the desired state. In other words, regulating a resetting operation can include placing the target memristive device (102) in one of multiple states while going from a low resistance state to a high resistance state. This is done by drawing current away from the target memristive device (102) as the target memristive device (102) approaches one of a number of states.

Using a parallel reset control device (104) allows for greater control over the reset operation, allowing the memristive devices (102) in an array (100) to be set to a number of intermediate states when going from an initial low resistance state towards a high resistance state. Such an operation may improve the functioning of various applications, for example, when tuning the resistance of a memristive device (102) for use in a neural network. For example, in neural networks, one of the most costly operations is that of back propagation. Back propagation is the use of an output of the neural network to train the resistances of the memristive devices (102) to a particular desired value. The resistances represent weights in matrix multiplication. In this operation, the resistances of the memristive devices (102) are changed toward convergence on a particular value. However, due to the difficulty in programming to intermediate resistance levels, this convergence process can be lengthy. By using the fine-tuned control afforded by the parallel reset control device (104), this convergence cycle may be shortened, thus reducing the time to convergence as well as the cost associated with such convergence.

Moreover, as neural networks use more than just binary levels, i.e., any intermediate analog level, the array (100) described herein with the parallel reset control device (104) opens the memristive devices (102) to be easily and effectively programmed to any one of these intermediate analog levels, while minimizing overshoot, thus allowing their use in neural networks.

Figure 2:
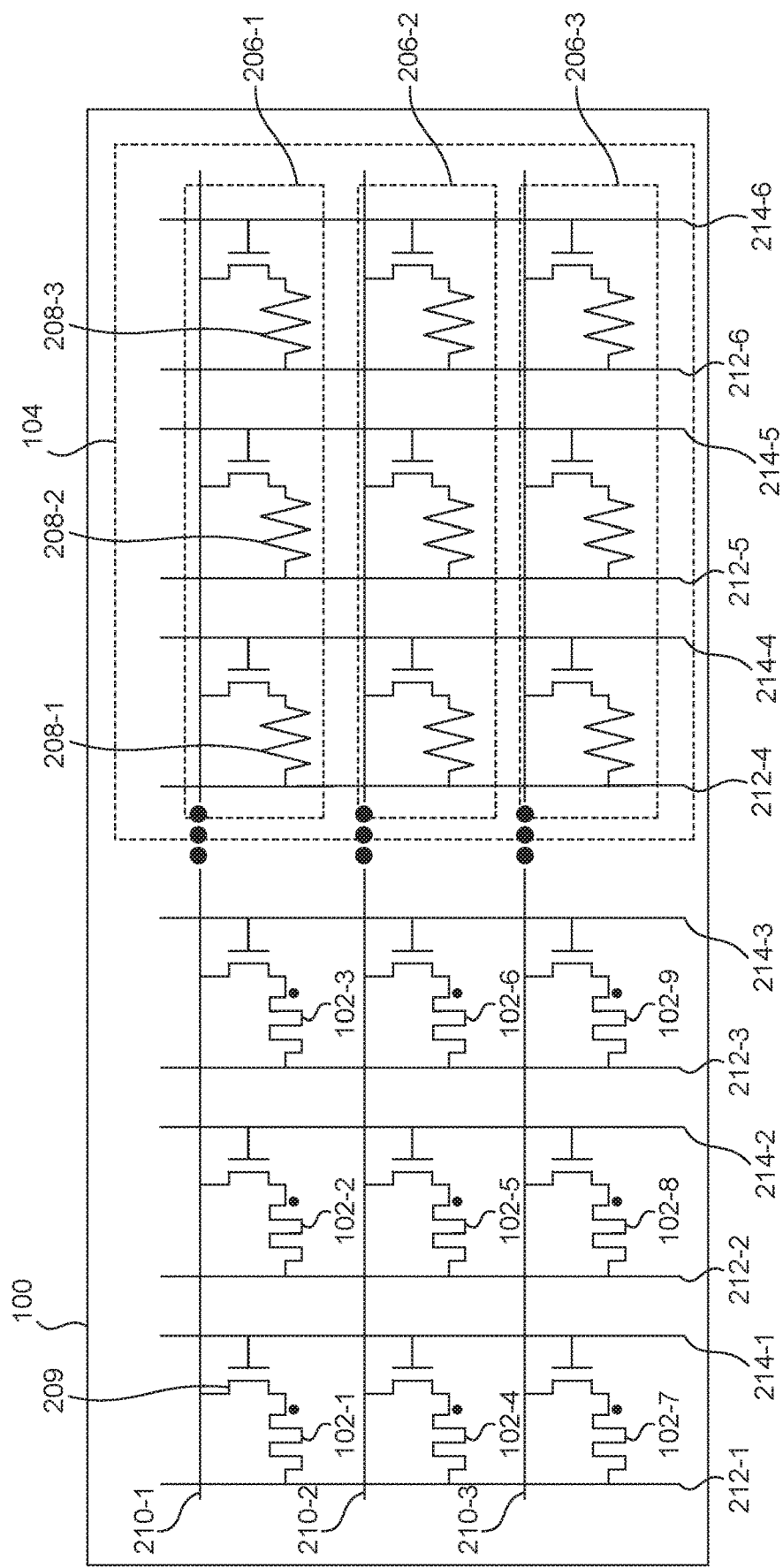
FIG. 2 is a diagram of a memristive array with resistor-type parallel reset controllers, according to one example of the principles described herein.

FIG. 2 is a diagram of a memristive array (100) with resistor-type parallel reset controllers (206-1, 206-2, 206-3), according to one example of the principles described herein. As depicted in FIG. 2, the memristive array (100) may be a crossbar array with a number of row lines (210-1, 210-2, 210-3) and a number of column lines (212-1, 212-2, 212-3, 212-4, 212-5, 212-6). The memristive devices (102) and below described parallel reset controllers (206) are coupled between row lines (210) and column lines (212) at the junctions. While FIG. 2 depicts a particular number of row lines (210), column lines (212), and memristive devices (102) any number of these components could be used in accordance with the principles described herein. In the figures, a top electrode of the memristive device (102) is indicated with a dot.

In some examples, the memristive array (100) is a one-transistor one-memristor (1T1M) array meaning that a selecting transistor (209) is coupled to each memristive device (102). For simplicity a single instance of a selecting transistor (209) is indicated with a reference number, however each memristive device (102) and each resistor (208) may be coupled to a similar selecting transistor (209).

The selecting transistor (209) reduces sneak current throughout the memristive array (100) and more fully isolates a corresponding memristive device (102) when targeted. For example, when the selecting transistor (209) is open, no current passes through the selecting transistor (209) and corresponding memristive device (102). By comparison, when the selecting transistor (209) is closed, current passes through the selecting transistor (209).

The selecting transistor (209) may be a set controller that regulates a set operation. For example, during a set operation, the selecting transistor (209) enforces compliance of a current passing through the memristive device (102) against one of a number of current thresholds. A current threshold corresponds to a state of the memristive device (102). By enforcing current compliance, the set operation can be stopped at any number of intermediate states when going in a set direction. Accordingly, in enforcing current compliance, the selecting transistor (209) stops the set operation when the current through the memristive device (102) matches a current threshold, which current threshold is set by the voltage applied on the gate of the selecting transistor (209). Accordingly, the memristive array (100) includes a number of gate lines (214-1, 214-2, 214-3, 214-4, 214-5, 214-5) that open or close transistors, such as the selecting transistors (209) coupled to memristive devices (102) and resistors (208) so as to more fully isolate those components during selection and to regulate the set operation via current compliance.

The parallel reset control device (104) depicted in FIG. 2 is a resistor-type control device. More specifically, the parallel reset control device (104) includes a number of parallel reset controllers (206-1, 206-2, 206-3). Each parallel reset controller (206) is coupled to, and corresponds to, a set of memristive devices (102) and is coupled to a row line (210) that corresponds to the set of memristive devices (102). Each parallel reset controller (206) regulates current flow through a corresponding row of memristive devices (102). For example, when a specific memristive device (102) is targeted, a corresponding parallel reset controller (206) is used to draw current away from the targeted memristive device. More specifically, if a first memristive device (102-1), is targeted, the corresponding parallel reset controller (206-1) may draw more and more current away from that first memristive device (102-1) as the resistance of the target memristive device (102-1) approaches a threshold value.

In the example depicted in FIG. 2, the parallel reset controllers (206) include a number of fixed value resistors (208-1, 208-2, 208-3). For simplicity, the resistors (208) of one parallel reset controller (206-1) are indicated with reference numbers and the remaining parallel reset controllers (206-2, 206-3) include fixed-value resistors (208) having a similar configuration. For example, the resistors in the same columns share the same resistance values; whereas those in different columns have different resistance values.

The resistances of these fixed value resistors (208) define a threshold value that corresponds to a target state for a memristive device (102). In some examples, the different resistors (208) may have different values and thereby define different threshold values. For example, each resistor (208-1, 208-2, 208-3) may have different resistance values each defining a different state for the memristive devices (102) in that row. Moreover combinations of different resistors (208) may be used to define even more threshold values. The threshold values described herein correspond to a state of a memristive device (102).

As the fixed-value resistors (208) are in parallel with the memristive devices (102) of a particular row, if a memristive device (102) of that row is targeted, the parallel fixed-value resistors (208) are used to limit current flow through the target memristive device (102) and thereby slow down and/or stop a reset operation. A specific example is given below. In this example, the first resistor (208-1) has a resistance value of 10,000 ohms (Ω), the second resistor (208-2) has a resistance of 500,000Ω, and the third resistor (208-3) has a resistance of 5,000,000Ω. In this example, the first memristive device (102-1) is targeted for activation and is targeted to be reset to a state corresponding to a resistance level of 10,000Ω. Accordingly, in this example, the gate lines (214-1, 214-4) corresponding to the target memristive device (102-1) and the first resistor (208-1) are activated so as to allow current to flow. Also, a voltage potential is applied across the first memristive device (102-1) by applying voltages to either end of the memristive device (102). More specifically a first voltage is applied to the first row line (210-1), and a first column line (212-1) corresponding to the first memristive device (102-1) is grounded. It is this voltage potential that initiates a reset operation by causing dopants within the switching layer of the memristive device (102) to move. A similar voltage potential is applied across the first resistor (208-1) by passing a voltage along the first row line (210-1) and grounding a fourth column line (212-4).

When in an initially low resistance state, current flows more readily through the first memristive device (102-1) than through the first resistor (208-1) as the first memristive device (102-1) in a low resistance state has less resistance than the 10,000Ω resistance of the first resistor (208-1). However, as dopants within the switching layer of the first memristive device (102-1) begin to move and the resistance of the first memristive device (102-1) increases towards the level of the first resistor (208-1), current is increasingly diverted from the first memristive device (102-1) towards the parallel first resistor (208-1). This diversion of current towards the first resistor (208-1) branch slows the reset operation. Still further, as the resistance of the first memristive device (102-1) reaches 10,000Ω, the current flows through both the first memristive device (102-1) and the first resistor (208-1) equally, thus stopping the reset operation by disallowing more current to flow through the first memristive device (102-1).

Put another way, the parallel reset control device (104) allows the resistances of a target memristive device (102) to be matched to a fixed resistance. As the resistance of a memristive device (102) defines a state of the memristive device (102), the state of a target memristive device (102) can therefore be set to any desired, intermediate level. Using fixed value resistors (208) as described herein allows for fine-tune resetting of memristive devices (102) without complex circuitry to control the operation.

While FIG. 2 describes activating one particular memristive device (102), more than one memristive device (102) may be programmed. For example, by activating one gate line (214-2), one column line (212-2), and multiple row lines (210-1, 210-2, 210-3) all memristive devices (102-2, 102-5, 102-8) in a particular column can be simultaneously programmed. In this fashion, a row's reset controller (206) regulates current flow through one target memristive cell per row. Accordingly, to program memristive devices (102) of multiple columns, multiple reset controllers (206) are used simultaneously to manage one target memristive cell per row.

Figure 3:
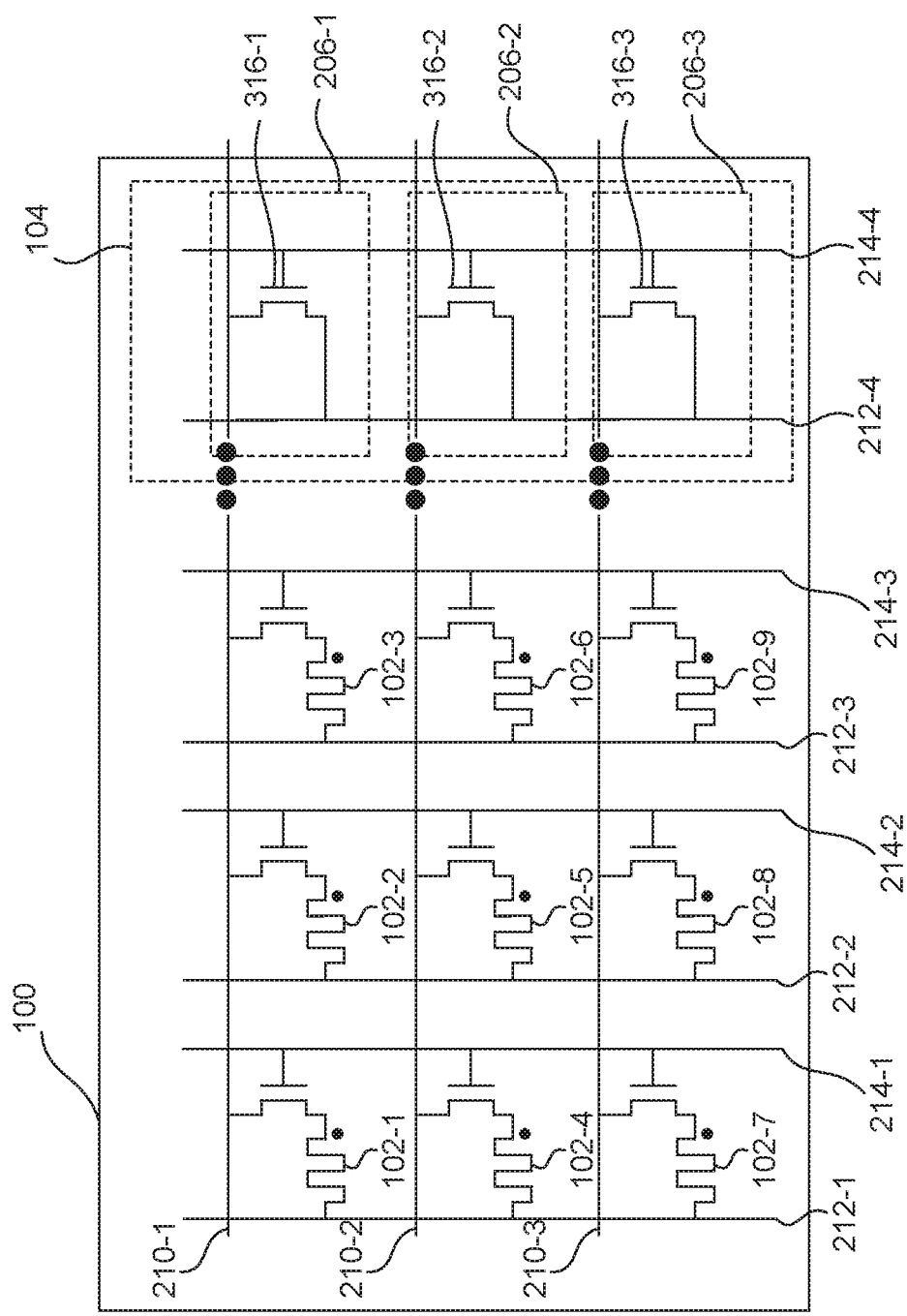
FIG. 3 is a diagram of a memristive array with transistor-type parallel reset controllers, according to one example of the principles described herein.

FIG. 3 is a diagram of a memristive array (100) with transistor-type parallel reset controllers (206), according to one example of the principles described herein. In this example, the set of fixed value resistors (FIG. 2, 208) are replaced by a single variable-resistance transistor (316). The resistance of the variable-resistance transistor (316) is changed by applying different voltages to the gates of the transistor (316) via the corresponding gate line (214-4). Different voltages applied to the gates of the transistors (316) modifies the channel resistance of those transistors (316). FIG. 3 depicts a transistor as being a voltage-control component; however, other active elements may be used to effect a voltage-controlled resistance change, but a transistor is used here as an example.

Similar to as described in FIG. 2, the target state of a memristive device (102), and a resistance threshold that corresponds to that state, is enforced on a target memristive device (102) by setting the resistance of the variable-resistance transistor (316). The resistance of the variable-resistance transistor (316) is set by applying a gate voltage to the variable-resistance transistor (316). More specifically, as the gate voltage on a variable-resistance transistor (316) is changed, so is the ability of that transistor (316) to conduct electricity, i.e., its resistance is changed. Accordingly, the resistance of the variable-resistance transistor (316) is changed by changing the voltage applied to the gate of the variable-resistance transistor (316). In other words, the threshold values that are used to define different states of the memristive devices (102) are defined by the various resistance levels that the variable-resistance transistor (316) can be set.

As a voltage potential across the memristive device (102) is effectuated, and a corresponding voltage potential across the variable-resistance transistor (316) is effectuated, the current starts flowing through the target memristive device (102) to reduce its conductivity. As the resistance of the target memristive device (102) rises and eventually reaches the level of the variable-resistance transistor (316), the reset operation slows and eventually stops once the resistance of the target memristive device (102) reaches the resistance of the variable-resistance transistor (316), which consequently indicates that the target memristive device (102) is at the desired state. Using the variable-resistance transistor (316) affords fine-tuned control of the reset operation while very marginally increasing the footprint over a memristive array without the reset control device.

Figure 4:
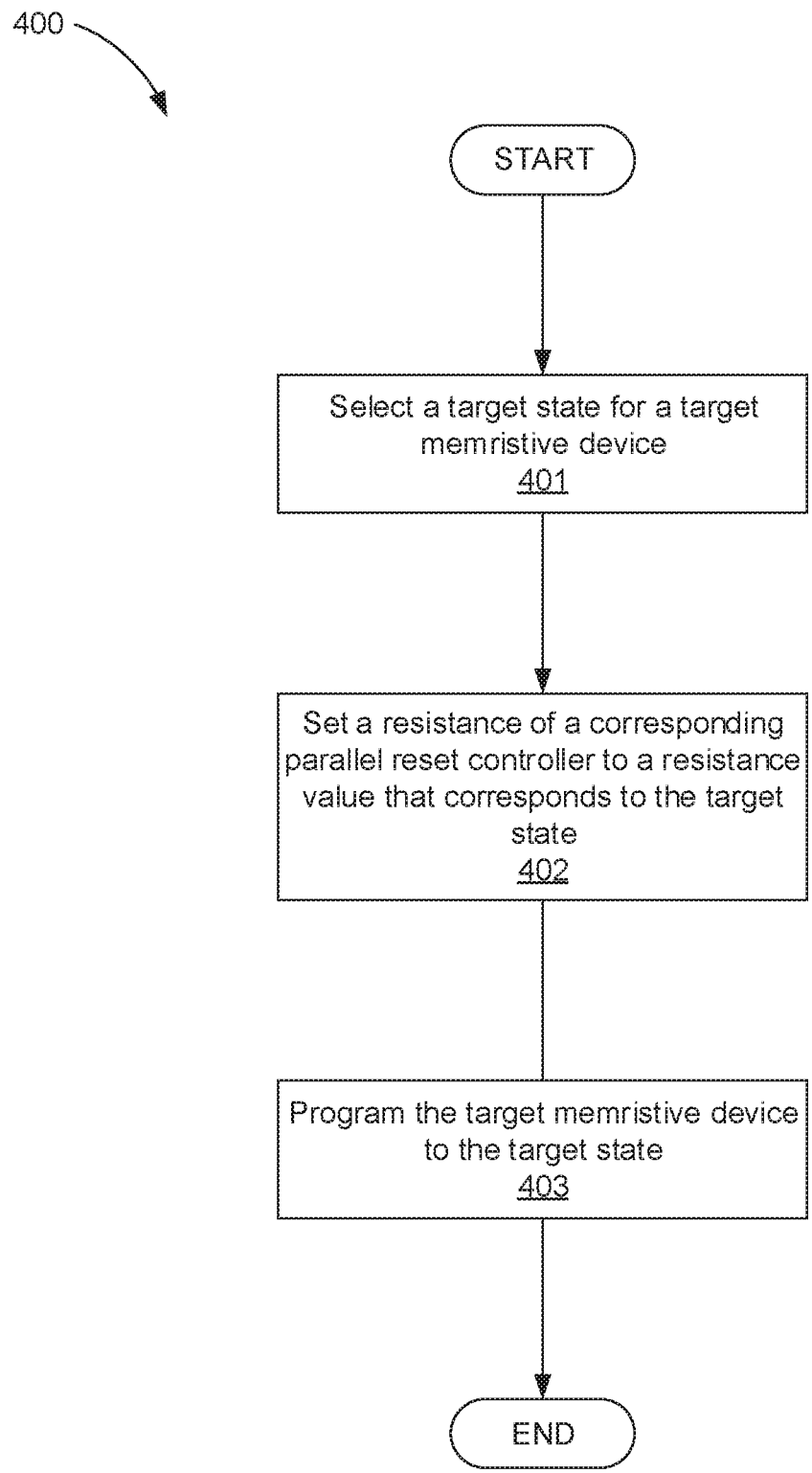
FIG. 4 is a flow diagram of a method for programming a memristive array with a parallel reset control device, according to one example of the principles described herein.

FIG. 4 is a flow diagram of a method (400) for programming a memristive array (FIG. 1, 100) with a parallel reset control device (FIG. 1, 104), according to one example of the principles described herein. According to the method (400), a target state for a target memristive device (FIG. 1, 102) is selected (block 401). More specifically, as described above, a memristive device (FIG. 1, 102) may have multiple states; for example a fully-on state, a fully-off state and a number of intermediate states. Historically setting a memristive device (FIG. 1, 102) to the number of intermediate states has been difficult, especially when the memristive device (FIG. 1, 102) is in an initially low resistance state, and to reset the memristive device (FIG. 1, 102) to an intermediate state includes increasing the resistance of the memristive device (FIG. 1, 102). This difficulty is due to a positive feedback during a reset operation that can lead to voltage runaway that overdrives the memristive device (FIG. 1, 102) and makes stopping the switching operation at an intermediate state quite difficult.

Returning to the method (400), the target state selected for the memristive device (FIG. 1, 102) may be an intermediate state that has a corresponding resistance level that is associated with the state. In other words, when the target memristive device (FIG. 1, 102) has this particular resistance level, the target memristive device (FIG. 1, 102) is at the corresponding state.

The resistance of a parallel reset controller (FIG. 2, 206) is then set (block 402) to a value that corresponds to the target state. For example, if the target intermediate state corresponds to a resistance value of 10,000Ω, the resistance of the parallel reset controller (FIG. 2, 206) is set to 10,000Ω. In the case that the parallel reset controller (FIG. 2, 206) includes a set of fixed-value resistors (FIG. 2, 208), setting (block 402) the resistance of the parallel reset controller (FIG. 2, 206) includes activating one of the resistors (FIG. 2, 208) within the set that corresponds to the target resistance value. For example, if a first fixed-value resistor (FIG. 2, 208-1) has a resistance value of 10,000Ω, the first fixed-value resistor (FIG. 2, 208-1) is activated by passing a voltage to a gate of a selecting transistor (FIG. 2, 209) corresponding to that first fixed-value resistor (FIG. 2, 208-1) such that current flows through the fixed value-resistor (FIG. 2, 208-1).

In the case that the parallel reset controller (FIG. 2, 206) includes a variable-resistance transistor (FIG. 3, 316), setting (block 402) the resistance of the parallel reset controller (FIG. 2, 206) includes setting the resistance of the variable-resistance transistor (FIG. 3, 316) to the target resistance value. For example, the variable-resistance transistor (FIG. 3, 316) can be set to have a resistance of 1,000Ω, by passing a voltage to a gate of a transistor (FIG. 3, 316).

The state of the target memristive device (FIG. 1, 102) can then be programmed (block 403) to the target state. More specifically, a voltage potential is generated across the target memristive device (FIG. 1, 102). In one specific example, a first voltage is applied to a row line (FIG. 2, 210) that corresponds to the target memristive device (FIG. 1, 102) and a first column line (FIG. 2, 212) that corresponds to the target memristive device (FIG. 1, 102) is set to ground. While specific reference is made to a first voltage and ground, any combination of voltage values and polarities may be used to generate a voltage potential across the target memristive device (FIG. 1, 102). Still further to activate the target memristive device (FIG. 1, 102) a second voltage may be applied to a gate of a selecting transistor (FIG. 2, 209) coupled to the memristive device (FIG. 1, 102). While FIGS. 1 and 2 depict a selecting transistor (FIG. 2, 209) coupled to the memristive device (FIG. 1, 102), the principles described herein may be implemented without a selecting transistor (FIG. 2, 209), although the selecting transistor serves to reduce sneak current and more fully isolate the target memristive device (FIG. 1, 102).

To couple the parallel reset controller (FIG. 2, 206) such that it can regulate current flow through a target memristive device (FIG. 1, 102), the individual fixed-value resistor (FIG. 2, 208) or the variable-resistance transistor (FIG. 3, 316) is also activated. This is done by generating a voltage potential across the fixed-value resistor (FIG. 2, 208) or the variable-resistance transistor (FIG. 3, 316) and closing any corresponding selecting transistor (FIG. 2, 209). The voltage potential can be generated by the first voltage that is passed through the row line (FIG. 2, 210) and grounding a second column line (FIG. 2, 212) that corresponds to the individual fixed-value resistor (FIG. 2, 208) or the variable-resistance transistor (FIG. 3, 316).

In this fashion, the parallel reset controller (FIG. 2, 206) is able to draw current away from the target memristive device (FIG. 1, 102) as the resistance approaches the resistance of the parallel reset controller (FIG. 2, 206) component, which resistance defines a state of the memristive device (FIG. 1, 102). As such, the target memristive device (FIG. 1, 102) can be set to any number of intermediate state levels. The fine-tune control afforded by the present specification lends well to applications where analog values, or more than two values, are to be represented by a memristive device (FIG. 1, 102). Such applications include training neural networks, digital signal processing, matrix multiplication, and others.

Figure 5:
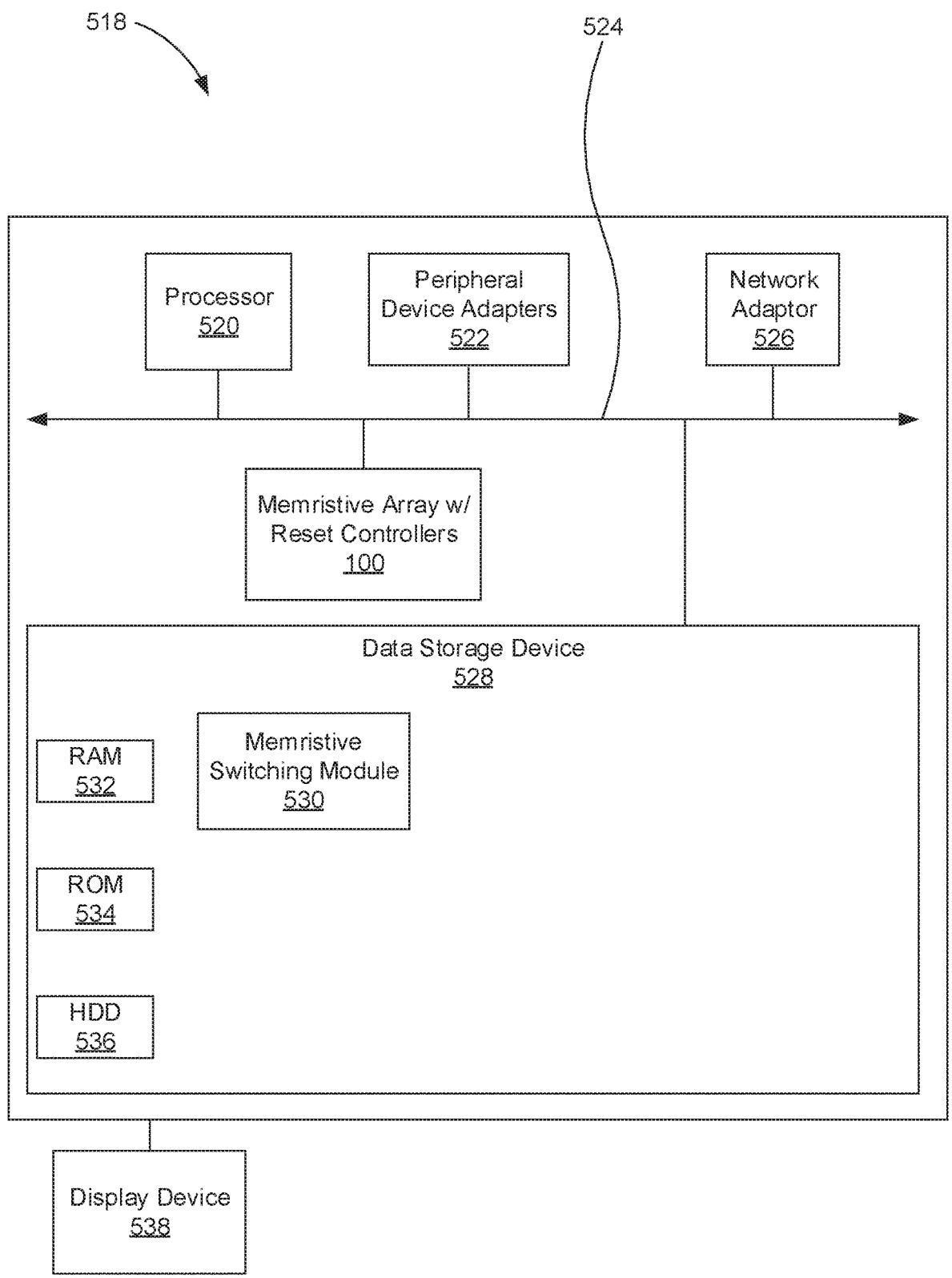
FIG. 5 is a diagram of a computing system that uses a memristive array with a parallel reset control device, according to one example of the principles described herein.

FIG. 5 is a diagram of a computing system (518) that uses a memristive array (100) with parallel reset controllers (FIG. 2, 206), according to one example of the principles described herein. The computing system (518) may be implemented in an electronic device. Examples of electronic devices include servers, desktop computers, laptop computers, personal digital assistants (PDAs), mobile devices, smartphones, gaming systems, and tablets, among other electronic devices.

The computing system (518) may be utilized in any data processing scenario including, stand-alone hardware, mobile applications, through a computing network, or combinations thereof. Further, the computing system (518) may be used in a computing network, a public cloud network, a private cloud network, a hybrid cloud network, other forms of networks, or combinations thereof. In one example, the methods provided by the computing system (518) are provided as a service over a network by, for example, a third party.

To achieve its desired functionality, the computing system (518) includes various hardware components. Among these hardware components may be a number of processors (520), a number of data storage devices (528), a number of peripheral device adapters (522), and a number of network adapters (526). These hardware components may be interconnected through the use of a number of busses and/or network connections. In one example, the processor (520), data storage device (528), peripheral device adapters (522), and a network adapter (526) may be communicatively coupled via a bus (524).

The processor (520) may include the hardware architecture to retrieve executable code from the data storage device (528) and execute the executable code. The executable code may, when executed by the processor (520), cause the processor (520) to implement at least the functionality of switching a memristive element (FIG. 1, 102) using a parallel reset control device (FIG. 1, 104). The functionality of the computing system (518) is in accordance to the methods of the present specification described herein. In the course of executing code, the processor (520) may receive input from and provide output to a number of the remaining hardware units.

The data storage device (528) may store data such as executable program code that is executed by the processor (520) or other processing device. As will be discussed, the data storage device (528) may specifically store computer code representing a number of applications that the processor (520) executes to implement at least the functionality described herein.

The data storage device (528) may include various types of memory modules, including volatile and nonvolatile memory. For example, the data storage device (528) of the present example includes Random Access Memory (RAM) (532), Read Only Memory (ROM) (534), and Hard Disk Drive (HDD) memory (536). Many other types of memory may also be utilized, and the present specification contemplates the use of many varying type(s) of memory in the data storage device (528) as may suit a particular application of the principles described herein. In certain examples, different types of memory in the data storage device (528) may be used for different data storage needs. For example, in certain examples the processor (520) may boot from Read Only Memory (ROM) (534), maintain nonvolatile storage in the Hard Disk Drive (HDD) memory (536), and execute program code stored in Random Access Memory (RAM) (532).

The data storage device (528) may include a computer readable medium, a computer readable storage medium, or a non-transitory computer readable medium, among others. For example, the data storage device (528) may be, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store computer usable program code for use by or in connection with an instruction execution system, apparatus, or device. In another example, a computer readable storage medium may be any non-transitory medium that can contain, or store a program for use by or in connection with an instruction execution system, apparatus, or device.

The hardware adapters (522, 524) in the computing system (518) enable the processor (520) to interface with various other hardware elements, external and internal to the computing system (518). For example, the peripheral device adapters (522) may provide an interface to input/output devices, such as, for example, display device (538), a mouse, or a keyboard. The peripheral device adapters (522) may also provide access to other external devices such as an external storage device, a number of network devices such as, for example, servers, switches, and routers, client devices, other types of computing devices, and combinations thereof.

The display device (538) may be provided to allow a user of the computing system (518) to interact with and implement the functionality of the computing system (518). The peripheral device adapters (522) may also create an interface between the processor (520) and the display device (538), a printer, or other media output devices. The network adapter (526) may provide an interface to other computing devices within, for example, a network, thereby enabling the transmission of data between the computing system (518) and other devices located within the network.

The computing system (518) may, when executed by the processor (520), display the number of graphical user interfaces (GUIs) on the display device (538) associated with the executable program code representing the number of applications stored on the data storage device (528). The GUIs may display, for example, interactive screenshots that allow a user to interact with the computing system (518) to input values in association with the memristive array (514) as will be described in more detail below. Additionally, via making a number of interactive gestures on the GUIs of the display device (538), a user may obtain a dot product value based on the input data. Examples of display devices (538) include a computer screen, a laptop screen, a mobile device screen, a personal digital assistant (PDA) screen, and a tablet screen, among other display devices (538).

The computing system (518) may further include a memristive array (100) that includes parallel reset controllers (FIG. 2, 206). Such an array (100) can be arranged as a cross-bar array.

The computing system (518) further includes a number of modules used in the implementation of the systems and methods described herein. The various modules within the computing system (518) include executable program code that may be executed separately. In this example, the various modules may be stored as separate computer program products. In another example, the various modules within the computing system (518) may be combined within a number of computer program products; each computer program product including a number of the modules.

The computing system (518) may include a memristive switching module (530) to, when executed by the processor (520), assist in the functionality of the memristive array (100). The memristive switching module (530), for example, is used to determine the voltages applied to the row lines (FIG. 2, 210), column lines (FIG. 2, 212), and gate lines (FIG. 2, 214). Still further the memristive switching module (530) operates to select a particular fixed-value resistor (FIG. 2, 208) by activating corresponding gate lines (FIG. 2, 214) and to set the resistance of the variable-resistance transistor (FIG. 3, 316). Still further the memristive switching module (530) may carry out the function of identifying a logic value associated with a particular resistance level of the memristive devices (FIG. 1, 102). The memristive switching module (530) also assists in selecting particular memristive devices (FIG. 1, 102) to target. While specific reference is made to a few particular operations, the memristive switching module (530) carries out a number of different operations in conjunction with the switching of memristive devices (FIG. 1, 102) in the memristive array (100).

Using a parallel reset control device (FIG. 1, 104) 1) allows for resetting a memristive device (FIG. 1, 102) to intermediate states; 2) reduces likelihood of over-driving the memristive device (FIG. 1, 102); 3) slows down the resetting operation thereby improving the convergence towards a target state; 4) maintains a small footprint on an integrated circuit; and 5) can be used in memory where a single memristive device (FIG. 1, 102) stores more than two bits of information. However, it is contemplated that the devices disclosed herein may provide useful in addressing other matters and deficiencies in a number of technical areas. Therefore the systems and methods disclosed herein should not be construed as addressing any of the particular matters.

The preceding description has been presented to illustrate and describe examples of the principles described. This description is not intended to be exhaustive or to limit these principles to any precise form disclosed. Many modifications and variations are possible in light of the above teaching.

What is claimed is:

1. A memristive array comprising:
a number of memristive devices, wherein a memristive device is switchable between states and is to store information; and
a parallel reset control device coupled to the number of memristive devices in parallel to regulate a resetting operation for the number of memristive devices by regulating current flow through target memristive devices, wherein the regulating of the resetting operation comprises drawing current away from a target memristive device as the target memristive device approaches a target state of the states between which the memristive device is switchable,
wherein the parallel reset control device comprises multiple sets of fixed value resistors each being coupled in parallel to a respective set of memristive devices and wherein the parallel reset control device comprises a plurality of parallel reset controllers, each parallel reset controller comprising a set of fixed value resistors of the multiple sets of fixed value resistors, each parallel reset controller being coupled in parallel to a set of the number of memristive devices in a row of the memristive array.

2. The memristive array of claim 1, wherein regulating a resetting operation comprises placing the target memristive device in one of multiple states while going from a low resistance state to a high resistance state.

3. The memristive array of claim 1, wherein the memristive devices are multi-level memristors.

4. The memristive array of claim 1, wherein a selecting transistor is coupled to each memristive device of the number of memristive devices.

5. The memristive array of claim 1, wherein each fixed value resistor of each set of fixed value resistors is configured with a different resistance level.

6. The memristive array of claim 5, wherein drawing current away from a target memristive device as the target memristive device approaches a target state of the states between which the memristive device is switchable comprises activating a corresponding fixed value resistor of a set of fixed value resistors coupled in parallel to the target memristive devices, the corresponding fixed value resistor having a resistance level associated with the target state.

7. A method for programming a memristive array comprising:
selecting a target state for a target memristive device;
setting a resistance of a parallel reset controller coupled to the target memristive device to a resistance value that corresponds to the target state, wherein the parallel reset controller comprises multiple sets of fixed value resistors each being coupled in parallel to a respective set of memristive devices comprising the target memristive device, and wherein the parallel reset controller is configured to regulate a resetting operation by drawing current away from a target memristive device as the target memristive device approaches the target state;
programming a state of the target memristive device to the target state by:
generating a voltage potential across the target memristive device by applying a first voltage to a row line corresponding to the target memristive device and a ground voltage to a first column line corresponding to the target memristive device; and
generating a voltage potential across the parallel reset controller.

8. The method of claim 7, wherein setting a resistance of the parallel reset controller to a resistance value comprises activating one of a set of fixed value resistors of the parallel reset controller.

9. The method of claim 7, wherein drawing current away from a target memristive device as the target memristive device approaches the target state comprises placing the target memristive device in one of multiple states while going from a first resistance state to the target resistance state.

10. A memristive crossbar array comprising:
a number of row lines;
a number of column lines intersecting the row lines to form a number of junctions;
a number of memristive devices coupled between the row lines and the column lines at the junctions, wherein a memristive device is switchable between states to store information;
multiple parallel reset controllers, a parallel reset controller coupled to a row line to regulate current through a corresponding row of memristive devices by drawing current away from a target memristive devices when a resistance of the target memristive device reaches a threshold value, the drawing including activating a corresponding fixed value resistor of a set of fixed value resistors coupled in parallel to the target memristive devices, the corresponding fixed value resistor having a resistance level associated with the target state, and wherein the parallel reset controllers each comprise multiple sets of fixed value resistors each being coupled in parallel to a respective row of a set of the number of memristive devices.

11. The memristive crossbar array of claim 10, further comprising a selecting transistor coupled to each of the memristive devices to regulate current flow through a corresponding memristive device.

12. The memristive crossbar array of claim 10, wherein the threshold value is one of a set of threshold values enforced by the parallel reset controller.

13. The memristive crossbar array of claim 12, wherein the resistance of each fixed value resistor defining a threshold value.

14. The memristive crossbar array of claim 10, further comprising a set controller to regulate the setting operation of a target memristive device.

15. The memristive crossbar array of claim 10, wherein a selecting transistor is coupled to each memristive device of the number of memristive devices.

16. A method for programming a memristive array comprising:
- selecting a target state for a target memristive device;
- setting a resistance of a parallel reset controller coupled to the target memristive device to a resistance value that corresponds to the target state, wherein the parallel reset controller comprises multiple sets of fixed value resistors each being coupled in parallel to a respective set of memristive devices comprising the target memristive device, and wherein the parallel reset controller is configured to regulate a resetting operation by drawing current away from a target memristive device as the target memristive device approaches the target state;
- programming a state of the target memristive device to the target state by:
  - generating a voltage potential across the target memristive device; and
  - generating a voltage potential across the parallel reset controller by applying first voltage to a row line corresponding to the target memristive device and grounding a second column line corresponding to a fixed value resistor of the parallel reset controller.

* * * * *